United States Patent
Chen

(10) Patent No.: US 7,295,486 B2
(45) Date of Patent: Nov. 13, 2007

(54) MEMORY AND DRIVING METHOD THEREFOR

(75) Inventor: Chung-Kuang Chen, Pan Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 64 days.

(21) Appl. No.: 11/391,990

(22) Filed: Mar. 29, 2006

(65) Prior Publication Data

US 2006/0280021 A1    Dec. 14, 2006

(30) Foreign Application Priority Data

Jun. 9, 2005    (TW) ................................ 94119129 A

(51) Int. Cl.
*G11C 8/00*    (2006.01)
(52) U.S. Cl. ............... 365/230.03; 365/63; 365/104
(58) Field of Classification Search ............ 365/230.06
See application file for complete search history.

(56) References Cited

U.S. PATENT DOCUMENTS 6,278,649 B1 *   8/2001   Lee et al. ............... 365/230.03
6,430,079 B1 *   8/2002   Shiau ........................ 365/104

* cited by examiner

*Primary Examiner*—Huan Hoang
(74) *Attorney, Agent, or Firm*—Thomas, Kayden, Horstemeyer & Risley

(57) ABSTRACT

A memory and a driving method therefor is provided. A j-th bank select MOS transistor is coupled to a j-th bit line and controlled by a bank select line. A j-th BD region is coupled to the j-th bank select MOS transistor. Gate(i, j) of memory cell M (i, j) is coupled to the i-th word line, the first source/drain(i, j) of memory cell M (i, j) is coupled to the j-th BD region, and the second source/drain(i, j) of memory cell M (i, j) is coupled to the first source/drain(i, j+1). In order to compensate the voltage drop resulting from the resistance of the j-th bit line and the j-th BD region, at least one of the voltage applied to the i-th word line and the voltage applied to the j-th bit line is adjusted according to the position of the bank which the memory cell M (i, j) belongs to.

20 Claims, 4 Drawing Sheets

MEMORY AND DRIVING METHOD THEREFOR

This application claims the benefit of Taiwan application Serial No. 94119129, filed Jun. 9, 2005, the subject matter of which is incorporated herein by reference.

BACKGROUND OF THE INVENTION

1. Field of the Invention

The invention relates in general to a memory and a driving method therefor, and more particularly to a semi-conductor memory and a driving method therefor.

2. Description of the Related Art

Every electronic product needs a memory for the purposes of data storage or operation buffer. Conventional semi-conductor memory includes a number of memory cells arranged in matrix form. Each memory cell is enabled by a corresponding word line. Each memory cell can be formed by a transistor for instance. When the memory is read or programmed or erased, corresponding bit line and word line of the memory cell to be operated are enabled accordingly. Whether the bit line is electrically connected to a sensing amplifier or a ground is determined according to a select switch.

A larger capacity of the memory is demanded. Particularly for the large capacity semi-conductor memory manufactured especially according to the non-BD (buried diffusion) strapping process or having a longer bit line memory, the source side body effect increases and the drain side voltage drops as the capacity of memory increases. Consequently, when two voltages of the same magnitude are respectively inputted to read two memory cells storing the same data but are positioned at different word lines, the currents obtained could differ widely.

For example, when two voltages of 5 V are provided to read two memory cells storing data 0 but are respectively positioned at the $1^{st}$ word line and the $128^{th}$ word line, the current flowing through the memory cell positioned at the $1^{st}$ word line equals 6 uA, and the current flowing through the memory cell positioned at the $128^{th}$ word line equals 12 uA. As the current of the memory cell differs wider, the range of the current distribution is also broaden, which making the circuit design even complicated.

Besides, when the memory cell is programmed, the efficiency of programming is reduced because of the following factors: (1) the cell drain side has voltage drop due to the buried diffusion voltage drop (BD voltage drop) or the metal bit line voltage drop (MBL voltage drop); (2) the cell source side has voltage increase due to the buried diffusion voltage increase (BD voltage increase) or the metal bit line voltage increase (MBL voltage increase). The decrease in the efficiency of programming is most significant when larger program current is used. Therefore, how to provide a method to narrow the range of the current distribution, reduce the complication of circuit design and increase the efficiency of programming is essential to the memory having the buried diffusion resistance loading (BD resistance loading) or the metal bit line resistance loading (MBL resistance loading).

SUMMARY OF THE INVENTION

It is therefore an object of the invention to provide a memory and a driving method therefor, effectively narrowing the distribution range of the current of the memory cells. Besides, when the memory is programmed or erased, the efficiency of programming and erasing can be effectively increased, so that the required time is reduced accordingly. Moreover, the memory has the advantage of reducing the program disturb effect.

The invention achieves the above-identified object by providing a memory and a driving method therefore. The memory includes P banks. Each bank includes X word lines, Y bit lines, a bank select line, Y bank select MOS (Metal Oxide Semiconductor) transistors, Y buried diffusion (BD) region, and X*Y memory cells in X rows and Y columns. P, X, and Y are integers. The X word lines are arranged in parallel. The X word lines include an i-th word line, i is an integer, and i is smaller or equal to X. The Y bit lines are substantially perpendicular to the word lines. The Y bit lines include a j-th bit line, j is an integer, and j is smaller or equal to Y. The Y bank select MOS transistors include a j-th bank select MOS transistor. The j-th bank select MOS transistor is coupled to the j-th bit line and controlled by the bank select line. The Y BD regions include a j-th BD region. The j-th BD region is coupled to the j-th bank select MOS transistor. The memory cells include a memory cell M (i, j) located in i-th row and j-th column. The memory cell M (i, j) has a gate(i, j), a first source/drain(i, j), and a second source/drain(i, j). The gate(i, j) is coupled to the i-th word line, the first source/drain(i, j) is coupled to the j-th BD region, and the second source/drain(i, j) is coupled to the first source/drain(i, j+1). When the memory cell M (i, j) is processed, the i-th word line is enabled, and the first source/drain(i, j) is coupled to the j-th bit line via the j-th BD region and the j-th bank select MOS transistor. In order to compensate the voltage drop resulting from the resistance of the j-th bit line and the j-th BD region, at least one of the voltage applied to the i-th word line and the voltage applied to the j-th bit line is adjusted according to the position of the bank which the memory cell M (i, j) belongs to.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
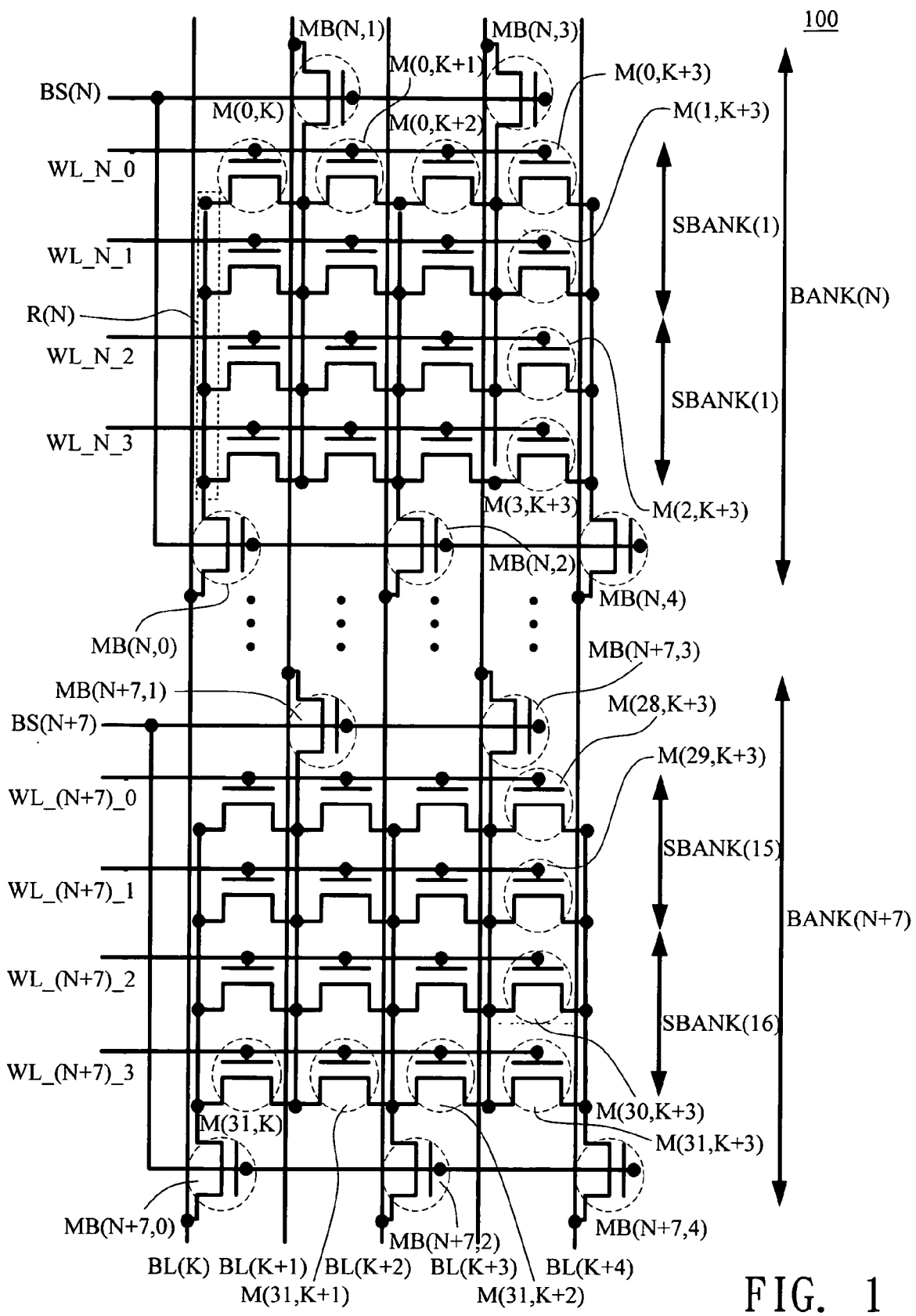
FIG. 1 is a diagram of a virtual ground equivalent circuit of a memory without BD strap according to a preferred embodiment of the invention.

Referring to FIG. 1. The naming rule of the word lines are defined as following. Take label "WL_N_0" for example: "WL" represents "word line", "N" represents "bank address", "0" represents "the word line sequence" inside the corresponding bank. In the same rule, "WL_(N+7)_4" represents the word line which is inside bank (N+7) and whose sequence number is 4.

Referring to FIG. 1, a diagram of a virtual ground equivalent circuit of a memory without BD strap according to a preferred embodiment of the invention is shown. Memory 100 includes a number of word lines WL, bit lines BL, bank select lines BS, bank select MOS (Metal Oxide Semiconductor) transistors MB, buried diffusion (BD) region R, and memory cells M. The memory 100 can be divided into a number of memory banks BANK, each can be further divided into a number of sub-memory banks SBANK. The memory 100 of the preferred embodiment is exemplified by word lines WL_N_0~WL_(N+7)_3, bit lines BL (K)~BL (K+4), band select lines BS(N) and BS(N+7), memory cells M (0, K)~M (31, K+3), bank select MOS transistor MB(N, 0)~MB(N+7,4), BD region R(N)~R(N+7), memory banks BANK (N)~BANK (N+7), and sub-memory banks SBANK (1)~SBANK (16).

The word line WL_N_0~WL_(N+7)_3 are arranged in parallel, and the bit line BL (K)~BL (K+4) are perpendicular to word line WL_N_0~WL_(N+7)_3. Each bank select MOS transistor M is coupled to one bit line and controlled by the corresponding bank select line BS. Each BD region is coupled to the corresponding select MOS transistor M. Each memory cell M has a gate, a first source/drain, and a second source/drain. The gate is coupled to the corresponding word line. The first source/drain is coupled to the corresponding BD region R. The second source/drain is coupled to the first source/drain of next adjacent memory cell in the same row. That is, each memory cell M is coupled to one of the word lines and two bank select MOS transistor that coupled to one of the bit lines.

Take memory cells M (0, K) and M (30, K+3) for example. The memory cell M (0, K) is coupled to the word line WL_N_0 and the bank select MOS transistors MB(N,0) and MB(N,1), which are coupled to bit lines BL (K) and BL(K+1) respectively. The memory cell M (30, K+3) is coupled to the word line WL_(N+7)_2 and the bank select MOS transistors MB(N+7,3) and MB(N+7,4), which are coupled to bit lines BL (K+3) and BL(K+4) respectively. Each memory cell M is formed by a transistor.

How the memory 100 of the embodiment is divided into 8 memory banks is illustrated in FIG. 1 and table one disclosed below. Table one is a reference table of each memory bank BANK. It can be clearly seen from table one that each memory bank BANK has four word lines WL, for instance, the memory bank BANK (N) has four word lines WL_N_0~WL_N_3 and memory cells M (0, K)~M (3, K+3) coupled to the four word lines WL_N_0~WL_N_3. The memory bank BANK (N+3) has four word lines WL_(N+3)_0~WL_(N+3)_3 and memory cells M (12, K)~M (15, K+3) coupled to the four word lines WL_(N+3)_0~WL_(N+3)_3. The memory bank BANK (N+7) has four word lines WL_(N+7)_0~WL_(N+7)_3 and memory cells M (28, K)~M (31, K+3) coupled to the four word lines WL_(N+7)_0~WL_(N+7)_3.

When one memory cell M among the memory cells M (0, K)~M (31, K+3) is processed, for example, is read, programmed or erased, the corresponding word line is enabled, the corresponding first source/drain is coupled to the corresponding bit line via the corresponding BD region and the corresponding bank select MOS transistor. In order to compensate the voltage drop resulting from the resistance of the corresponding bit line and the corresponding BD region, at least one of the voltage applied to the corresponding word line and the voltage applied to the corresponding bit line is adjusted according to the position of the bank which the selected memory cell M belongs to. Consequently, the broadening of the current distribution of the memory cell M which occurs when the drain side voltage drops and source side voltage rises due to metal bit line resistance loading or the BD resistance loading is prevented. The adjustment of the voltage applied to the corresponding word line or the voltage applied to the corresponding bit line coupled to the selected memory cell M is exemplified below.

Take memory cells M (0, K), M (12, K+3) and M (30, K+3) for example. The memory cells M (0, K), M (12, K+3) and M (30, K+3) are respectively coupled to the word lines WL_N_0, WL_(N+3)_0 and WL_(N+7)_2, and that the word lines WL_N_0, WL_(N+3)_0 and WL_(N+7)_2 and the memory cells M (0, K), M (12, K+3) and M (30, K+3) are respectively positioned within the memory banks BANK (N), BANK (N+3) and BANK (N+7).

When reading memory cells M (0, K), the bank select MOS transistor MB(N, 0) is enabled, the word lines WL_N_0 is enabled, the bit line BL(K) is coupled to a sense amplifier (not shown), and the bit line BL(K+1) is grounded. Then, a current flows through the bit line BL(K), the band select MOS transistor MB(N, 0), the memory cell M (0, K), and the bit line BL(K+1), the sense amplifier senses the magnitude of the current and recognize the data, i.e. logic value "0" or "1", stored in the memory cell M (0, K). Due to the resistance loading of part metal bit line BL(K), that is, the resistance of the segment between the top of the metal bit line BL(K) and the contact point with MB(N, 0), the resistance of MB(N, 0), and the resistance of the segment of the BD region R(N) between the first source/drain of M (0, K) and MB(N, 0), voltage drop from the output voltage of the sense amplifier occurs. Namely, the drain side voltage of memory cell M (0, K) is approximately equal to the output voltage of the sense amplifier minus the voltage drop.

The operation when reading M (12, K+3) and M (30, K+3) is similar to the operation when reading M (N, 0) described above. Due to the position of the memory cells M (0, K), M (12, K+3) and M (30, K+3) are different, the effective resistance of the metal bit line BL(K) and the effective resistance of the BD region R(N) viewed by M (0, K), M (12, K+3) and M (30, K+3) are different. Therefore, the voltage drop corresponding to M(0, K), M (12, K+3) and M (30, K+3) are also different.

In order to compensate the voltage drop resulting from the effective resistance of the corresponding bit line and the effective resistance of the corresponding BD region, the voltage applied to the word lines WL_N_0, WL_(N+3)_0 and WL_(N+7)_2 can be adjusted according to the position of the bank BANK (N), BANK (N+3) and BANK (N+7), or the voltage applied to the bit lines BL(K), BL(K+3), and BL(K+3) can be adjusted according to the position of the bank BANK (N), BANK (N+3) and BANK (N+7). For example, the voltages of 1.5V, 1.8V and 2.2V are respectively provided to the bit line BL (K), BL (K+3), and BL (K+3) when reading the data stored in the memory cells M (0, K), M (12, K+3) and M (30, K+3).

Figure 2:
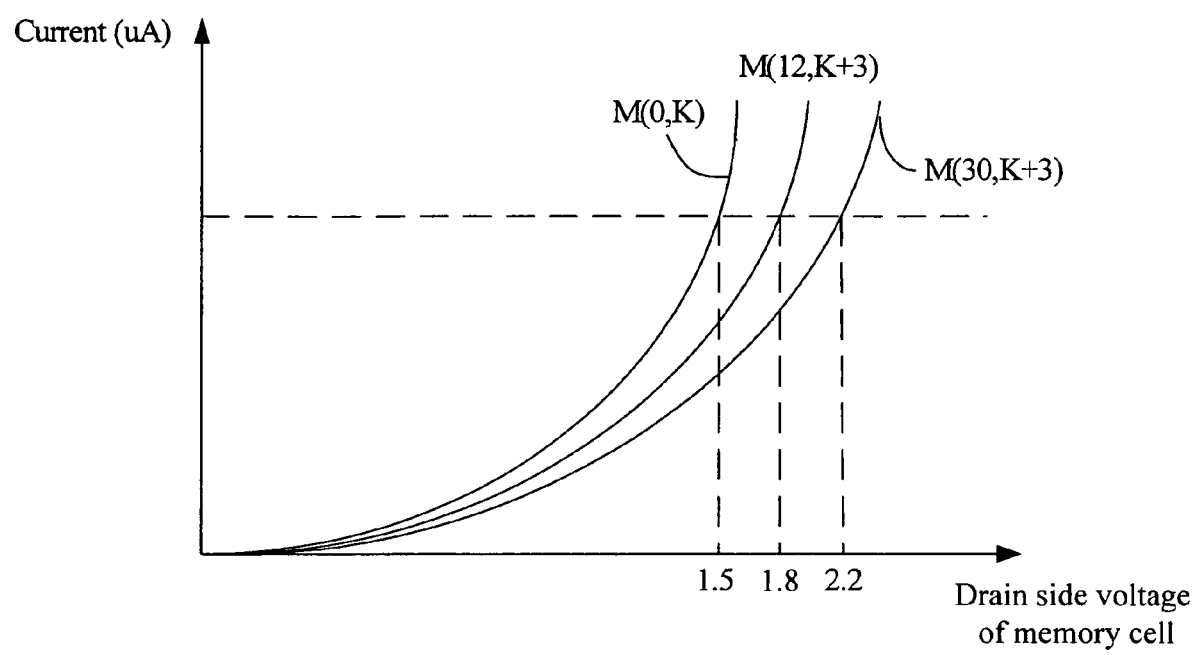
FIG. 2 is a an example diagram showing the current flowing through the memory cells when different bit line voltages are applied to the memory cells coupled to different bit lines.

Refer to FIG. 2, which is an example diagram showing the current flowing through the memory cells when different bit line voltages are applied to the memory cells coupled to different bit lines. The horizontal axis denotes the voltage provided to the bit line, and the vertical axis denotes the current flowing through the memory cell. The value of the voltage applied to different bit lines can be chosen according to the relationship in FIG. 2. The experiment results show that when the memory cells M (0, K), M (12, K+3) and M (30, K+3) store data 0 for instance and that the memory cells are read with different bit line voltages 1.5V, 1.8V, and 2.2V provided, the currents flowing through the memory cells are all approximately equal to 6 uA as shown in FIG. 2.

The above method divides the memory into 8 memory banks, and different bit line voltage values are provided according to different memory banks. However, there is no particular restriction with regards to how many memory banks each memory is divided into. In one another embodiment, voltage values provided to the bit lines in some of the memory banks can be the same. For example, the memory can be divided into 32 memory banks. When the bit line coupled to the to-be-processed memory cell is positioned at one of the 1$^{st}$ to the 16$^{th}$ memory banks, a voltage value of 1.5 V is provided to the bit line of the memory cell. When the bit line coupled to the to-be-processed memory cell is positioned at one of the 1$^{st}$ to the 17$^{th}$ memory banks, a voltage value of 1.7 V is provided to the bit line of the memory cell. Besides, in table one, the memory cell drain side voltage values of different bit lines provided to different memory banks, before leaving the factory for instance, are determined by referring to the equation V=IR, in which "R" corresponds to the resistance of the metal bit line and the resistance of the BD region, and "I" corresponds to the current flow in through the bit line. The memory cell drain side voltage values of different bit lines are preferred to be stored in the memory 100.

memory cells M (0, K)~M (1, K+3) coupled to the word lines WL_N_0~WL_N_1 are also positioned within the sub-memory bank SBANK (1). The sub-memory bank SBANK (8) has two word lines WL_(N+3)_2~WL_(N+3)_3, so that the memory cells M (14, K)~M (15, K+3 ) coupled to the word lines WL_(N+3)_2~WL_(N+3)_3 are also positioned within the sub-memory bank SBANK (8). The sub-memory bank SBANK (16) has two word lines WL_(N+7)_2~WL_(N+7)_3, so that the memory cells M (30, K)~M (31, K+3) coupled to the word line WL_(N+7)_2~WL_(N+7)_3 are also positioned within the sub-memory bank SBANK (16).

When the memory cells M (0, K), M (12, K+3) and M (30, K+3) are respectively read, given that the memory cells M (0, K), M (12, K+3) and M (30, K+3) are respective coupled to the word lines WL_N_0, WL_(N+3)_0 and WL_(N+7)_2, and that the word lines WL_N_0, WL_(N+3)_0 and WL_(N+7)_2 are respectively positioned within the sub-memory banks SBANK (1), SBANK (7) and SBANK (16), so the voltage of 1.5 V, 1.8 V and 2.25 V are respectively provided to the bit lines BL (K), BL (K+3), and BL (K+3), and 0V provided to the bit lines BL(K+1), BL(K+4), and BL(K+4) when reading the data stored in the memory cells M (0, K),

TABLE ONE

Reference Table of Memory Blocks

| Memory Block | Word Line | Memory Cell | Voltage Provided to the Bit Line |
|---|---|---|---|
| BANK (N) | WL_N_0~WL_N_3 | M (0, K)~M (3, K + 3) | 1.5 V |
| BANK (N + 1) | WL_(N + 1)_0~WL_(N + 1)_3 | M (4, K)~M (7, K + 3) | 1.6 V |
| BANK (N + 2) | WL_(N + 2)_0~WL_(N + 2)_3 | M (8, K)~M (11, K + 3) | 1.7 V |
| BANK (N + 3) | WL_(N + 3)_0~WL_(N + 3)_3 | M (12, K)~M (15, K + 3) | 1.8 V |
| BANK (N + 4) | WL_(N + 4)_0~WL_(N + 4)_3 | M (16, K)~M (19, K + 3) | 1.9 V |
| BANK (N + 5) | WL_(N + 5)_0~WL_(N + 5)_3 | M (20, K)~M (23, K + 3) | 2.0 V |
| BANK (N + 6) | WL_(N + 6)_0~WL_(N + 6)_3 | M (24, K)~M (27, K + 3) | 2.1 V |
| BANK (N + 7) | WL_(N + 7)_0~WL_(N + 7)_3 | M (28, K)~M (31, K + 3) | 2.2 V |

However, if the memory 100 has a large buried diffusion resistance loading, a severe voltage drop is caused. Each memory bank BANK of the memory 100 is preferred further divided into two sub-memory banks SBANK for instance. By doing so, the memory 100 can be divided into 16 sub-memory banks SBANK. When one memory cell M among the memory cells M (0, K)~M (31, K+3) is read, programmed or erased, the voltage of the word line WL or the bit line BL coupled to the memory cell M is adjusted according to the sub-memory bank SBANK at which the word line WL coupled to the memory cell M is positioned. Consequently, the broadening of the current distribution of the memory cell which occurs when the voltage drops due to metal word line resistance loading and the buried diffusion resistance loading is prevented. Under the same current distribution of memory matrix, by increasing the number of the word lines within the memory bank and the number of the word line between the strapping contacts, the chip size can be reduced effectively. The adjustment of the voltage of the bit line BL coupled to the memory cell M according to the sub-memory bank SBANK at which the word line WL coupled to the memory cell M is positioned is exemplified below.

Referring to both FIG. 1 and table two, table two is a reference table of sub-memory banks. It can be clearly seen from table two that each sub-memory bank SBANK has two word lines WL, for instance, the sub-memory bank SBANK (1) has two word lines WL_N_0~WL_N_1, so that the M (12, K+3) and M (30, K+3). Besides, in the selected bank, the corresponding bank select MOS transistors also need to be turned on to connect both corresponding memory cells and corresponding bit lines. For example, when reading M (0,K), signal BS(N) needs to be enabled to turn on MB(N, 0) and MB(N, 1), and when reading M (30,K+3), signal BS(N+7) needs to be enabled to turn on MB(N+7, 3) and MB(N+7, 4).

Referring to table one and table two, memory cell drain side voltages are generated by adding voltage drop due to the resistance of the metal bit line and the resistance of the buried diffusion region base on the same reference voltage value, for example.

Figure 3A:
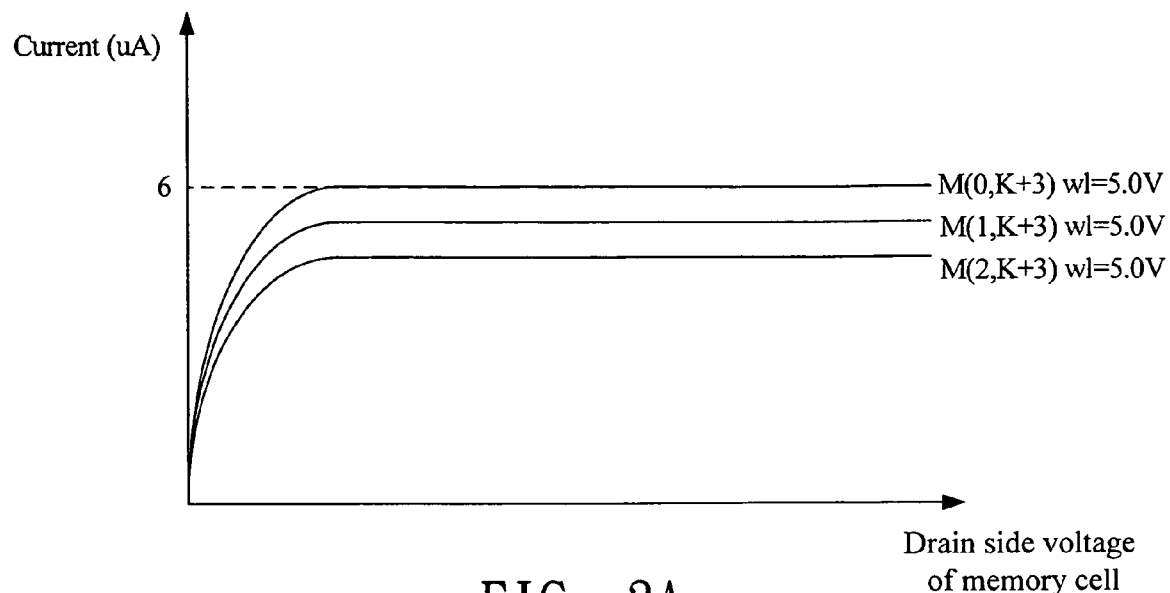
FIG. 3A and FIG. 3B is an another example diagram showing the current flowing through the memory cells when the cells operate in saturation region when different drain side voltages are applied.
Figure 3B:
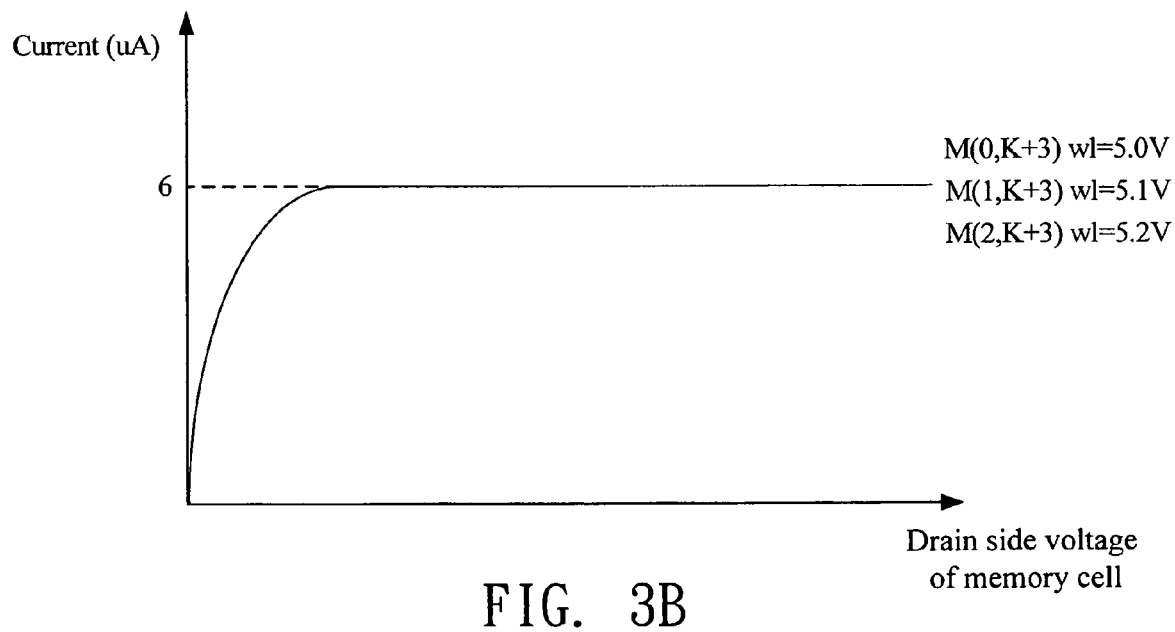

Referring to FIG. 3A and FIG. 3B, which is another example diagram showing the current flowing through the memory cells when the cells operate in saturation region when different drain side voltages are applied. Assume memory cells M (0, K+3), M (1, K+3) and M (2, K+3) operate in saturation region, WL_N_0, WL_N_1, WL_N_2 are coupled to 5.0V, BL(K+3) is coupled to 1.6V, and BL(K+4) is coupled to 0V, then M (0, K+3), M (1, K+3), M (2, K+3) will have different cell current, as shown in FIG. 3A. But in this saturation when M (0, K+3), M (1, K+3), M (2, K+3) operate in saturation region, changing the drain side voltage doesn't make the memory cells have the same current. Therefore, the better to way make the memory cells have the same current is to couple the word lines to different voltages.

Refer to FIG. 3B, after biasing the word lines WL_N_0, WL_N_1, WL_N_2 corresponding to memory cells M (0,K+3), M (1,K+3), M (2,K+3) to 5.0V, 5.1V, 5.2V, and applying 1.6V BL(K+3) and 0V to BL(K+4), it is shown in FIG. 3B that currents with the same magnitude flow through memory cells M (0, K+3), M (1, K+3), M (2, K+3).

Adjusting the drain side voltage of the memory cell or adjusting the word line voltage can be done at the same time or not. Whether it should be done at the same time or not dependents mainly on the efficiency of the memory to have smaller currents and consume less power. Except adjusting the drain side voltage of the memory cell, the source side voltage of the memory cell can also be adjusted.

The experiment results show that when the data stored in the memory cells M (0, K), M (1, K+3) and M (3, K+3) share the same logic value, different cell drain side bit line voltages or cell gate side word line voltages are provided according to the positions of BANK(N), BANK(N+3), and BAND(N+7) to read the memory cells, the distribution range of the currents flowing through the memory cells is narrowed. By doing so, the current distribution of the memory with a lot of memory cells is effectively reduced.

It is noteworthy that there is no particular restriction with regards to how many sub-memory banks each memory bank is divided into. The bit line voltage values provided in different sub-memory banks are not necessarily all different. Besides, in table two, the voltage values of different bit lines provided to different sub-memory banks, before leaving the factory for instance, are determined according to the level of voltage drops and stored inside the memory 100.

The above description is exemplified on how to adjust the voltage of the bit line BL. However, the voltage of the word line WL can also be adjusted base on similar way. Therefore, the broadening of the current distribution of the memory cell which occurs when the voltage drops due to metal word line resistance loading and the buried diffusion resistance loading is prevented.

Figure 4:
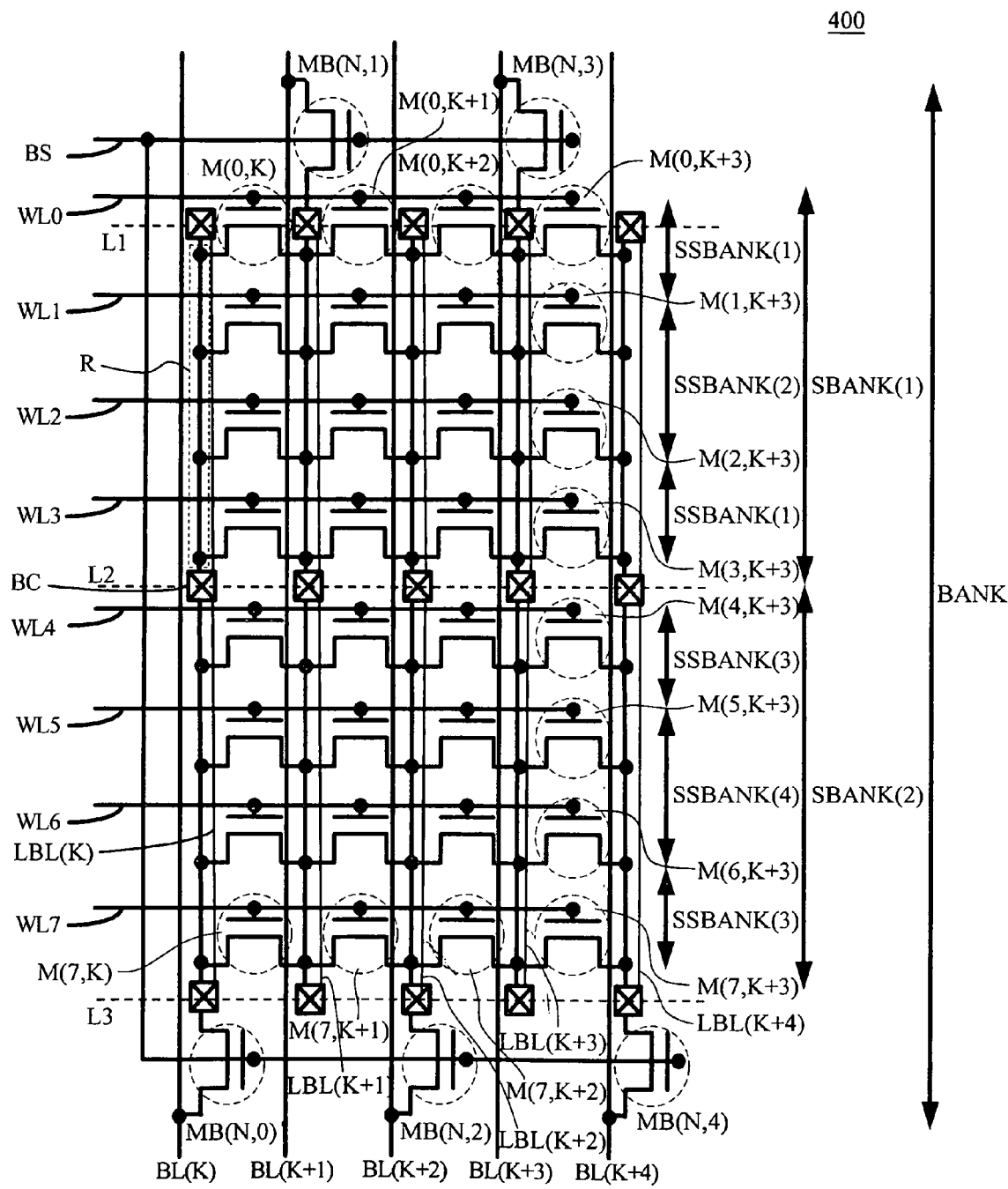
FIG. 4 is a diagram of a virtual ground equivalent circuit of a memory with BD strap according to another preferred embodiment of the invention.

Referring to FIG. 4, a diagram of a virtual ground equivalent circuit of a memory with BD strap according to another preferred embodiment of the invention is shown. What differs from memory 100 in FIG. 1 is that Memory 400 further includes BD strap contacts BC and BD strap local-bit lines LBL. The BD strap contacts BC are one kind of through holes, and the BD strap local bit lines LBL are made of metal which has lower resistance than BD region R which is an $N^+$ diffusion region. Memory 400 is manufactured by using the BD strap process. The BD strap contacts are arranged in several lines substantially parallel to the word lines WL, for example, lines L1, L2, and L3 as shown in FIG. 4. Each BD region R being coupled to the corresponding BD strap local bit line via 3 strap contacts of the strap contacts, two of the 3 strap contacts are coupled to the two ends of the corresponding BD region R.

Each bank BANK of the memory 400 can be divided into a number of memory sub-banks SBANK according to the BD strap physical position. For example, each bank BAND is divided to 2 sub-banks SBANK. Each sub-bank SBANK is defined by two adjacent lines. Take sub-bank SBANK(1) for example, sub-bank SBANK(1) is defined by line L1 and line L2 which are adjacent to each other. At least one of the voltage applied to the word lines and the voltage applied to the bit lines is adjusted further according to the position of the sub-bank SBANK which the corresponding memory cell M belongs to.

Each SBANK can be further divided into a number of sub-memory banks SSBANK according to the relation of memory cells and the BC. Each sub-sub-bank SSBANK includes memory cells in two rows, i.e., memory cells coupled to two word lines. The distance between the sources/drains of the memory cells M in one of the two rows and one of the two lines is substantially equal to the distance between the source/drains of the memory cells M in the other row of the two rows and the other of the two lines. At least one of the voltage applied to the corresponding word line and the voltage applied to the corresponding bit line is adjusted further according to the position of the sub-sub-bank SSBANK which the corresponding memory cell M belongs to.

Referring to FIG. 4; WL0 and WL3 are in the same SSBANK(1), WL1 and WL2 are in the same SSBANK(2). Memory cells are grouped to several sub-sub-banks SSBANK according to the resistance value that will cause similar voltage drop. For example, sub-sub-bank SSBAND (1) includes the memory cells M coupled to word lines WL0 and WL3. The distance between the sources/drains of the memory cells M coupled to WL0 and line L1 is substantially equal to the distance between the source/drains of the memory cells M coupled to WL3 and line L2. The voltage applied to the word line WL0 can be adjusted further according to the position of the sub-sub-bank SSBANK(1). The voltages applied to the BL(K)~BL(K+4) when processing memory cells M (0, k)~M (0, K+3) can be also adjusted further according to the position of the sub-sub-bank SSBANK(1). The resistance BD region R viewed by the memory cells in one sub-sub-bank SSBANK are substantially the same, and the voltage drops are substantially the same, thus it is workable to apply the same voltage to the word lines in the same SSBANK or apply the same voltage to the bit lines in the same SSBANK.

The memory 400 manufactured by using the BD strap process can reduce the effective resistance of BD region R viewed by the memory cell when the memory cell is processed. When the invention is applied in memory using the BD strap process, the more concentrated current distribution of the memory cells can also be achieved.

This invention is very suitable for both the memory with non-BD strap in FIG. 1 and the memory with BD strap. The word line number of each block especially in the memory with BD strap can be further increased.

In practical application, how the method of reducing the current distribution of the memory cell to be implemented can accord to the actual metal bit line voltage (MBL voltage) and the actual buried diffusion voltage (BD voltage). For example, when the metal word line causes a severe voltage drop, each memory is divided into a number of memory banks, and then the voltage of the word line coupled to the memory cell and the voltage of the bit line coupled to the memory cell are adjusted at the same time according to the memory bank which the to-be-process memory cell belong to. When both the voltage drop in the metal word line and the voltage drop in the buried diffusion are severe, each memory is divided into a number of memory banks, and each memory bank is further divided into a number of sub-memory banks, and then the voltage of the bit line coupled to the memory cell is adjusted according to the positions of the sub-memory which the to-be-process memory cell belong to.

TABLE TWO

Reference Table of Sub-Memory Blocks

| Sub-memory Block | Word Line | Memory Cell | Voltage Provided to the Bit Line |
|---|---|---|---|
| SBANK (1) | WL_N_0~WL_N_1 | M (0, K)~M (1, K + 3) | 1.50 V |
| SBANK (2) | WL_N_2~WL_N_3 | M (2, K)~M (3, K + 3) | 1.53 V |
| SBANK (3) | WL_(N + 1)_0~WL_(N + 1)_1 | M (4, K)~M (5, K + 3) | 1.60 V |
| SBANK (4) | WL_(N + 1)_2~WL_(N + 1)_37 | M (6, K)~M (7, K + 3) | 1.63 V |
| SBANK (5) | WL_(N + 2)_0~WL_(N + 2)_1 | M (8, K)~M (9, K + 3) | 1.70 V |
| SBANK (6) | WL_(N + 2)_2~WL_(N + 2)_3 | M (10, K)~M (11, K + 3) | 1.73 V |
| SBANK (7) | WL_(N + 3)_0~WL_(N + 3)_1 | M (12, K)~M (13, K + 3) | 1.80 V |
| SBANK (8) | WL_(N + 3)_2~WL_(N = 3)_3 | M (14, K)~M (15, K + 3) | 1.83 V |
| SBANK (9) | WL_(N + 4)_0~WL_(N + 4)_1 | M (16, K)~M (17, K + 3) | 1.90 V |
| SBANK (10) | WL_(N + 4)_2~WL_(N + 4)_3 | M (18, K)~M (19, K + 3) | 1.93 V |
| SBANK (11) | WL_(N + 5)_0~WL_(N + 5)_1 | M (20, K)~M (21, K + 3) | 2.00 V |
| SBANK (12) | WL_(N + 5)_2~WL_(N + 5)_3 | M (22, K)~M (23, K + 3) | 2.03 V |
| SBANK (13) | WL_(N + 6)_0~WL_(N + 6)_1 | M (24, K)~M (25, K + 3) | 2.10 V |
| SBANK (14) | WL_(N + 6)_2~WL_(N + 6)_3 | M (26, K)~M (27, K + 3) | 2.13 V |
| SBANK (15) | WL_(N + 7)_0~WL_(N + 7)_1 | M (28, K)~M (29, K + 3) | 2.20 V |
| SBANK (16) | WL_(N + 7)_2~WL_(N + 7)_3 | M (30, K)~M (31, K + 3) | 2.23 V |

Referring to table 2, word line voltage level can be defined by both bank address and sequence address inside one bank. Bank address will define the base drain side voltage or base word line voltage of the word lines inside one bank. For example: BANK_N=1.5V, BANK_N+1=1.6V, BANK_N+2=1.7V, BANK_N+3=1.8v . . . etc. Inside the bank, the drain side voltage or word line voltage of each sub-bank is determined according to the BD voltage drop by referring to the corresponding bank base voltage which is determined according to the metal bit line resistance. For example base on above voltage and add voltage: BANK_N=1.5V and 1.53V, BANK_N+1=1.6V and 1.63V . . . etc.

The memory disclosed in above embodiment of the invention considers the buried diffusion resistance (BD resistance) and the metal bit line resistance (MBL resistance) as well as the unexpected voltage drop cause the body effect. Different word line voltages or bit line voltages are provided according to the different addresses of the word line within the memory, so that the distribution range of the current of the memory cell is narrowed and that the complexity of circuit design is reduced accordingly. Besides, when the memory is programmed or erased, different bit line voltages are provided to different memory cells, so that the efficiency of programming and erasing is effectively increased and that the program disturbing effect is reduced as well.

Referring to FIG. 1 and FIG. 4, bank select MOS transistors (MB) also provide a serial resistance in the current path, so the gate voltage of the MB can be another option to be adjusted. According to the different bank address or word line sequence address inside the bank, gate voltages of MB can be set in different voltage when corresponding memory cells are processed.

Memory cells M can be formed on the same substrate or different substrates, wherein the substrate may be defined as bulk or well. Referring to above description, body effect in memory cells can also be improved by tuning the substrate (well) bias. Biasing substrate (well) in different voltage according to the position of the bank and the position of the bank, the sub-bank, or the sub-sub-bank which the memory cell M (i, j) belongs to can also improve the cell current distribution by decreasing the body effect. For exampled, when the memory cell M (i, j) is processed, the voltage applied to the substrate on which the memory cell M (i, j) is formed is adjusted according to the position of the bank and the position of the sub-bank which the memory cell M (i, j) belongs to.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory, comprising P banks, P being integer, each bank comprising:

X word lines arranged in parallel, the X word lines comprising an i-th word line, X, i being integers, i being smaller or equal to X;

Y bit lines substantially perpendicular to the word lines, the Y bit lines comprising a j-th bit line, Y and j being integers, j being smaller or equal to Y;

a bank select line;

Y bank select MOS (Metal Oxide Semiconductor) transistors, comprising a j-th bank select MOS transistor, the j-th bank select MOS transistor being coupled to the j-th bit line and controlled by the bank select line;

Y buried diffusion (BD) regions, comprising a j-th BD region, the j-th BD region being coupled to the j-th bank select MOS transistor; and X*Y memory cells in X rows and Y columns, the memory cells comprising a memory cell M (i, j) located in i-th row and j-th column, the memory cell M (i, j) having a gate(i, j), a first source/drain(i, j), and a second source/drain(i, j), the gate(i, j) being coupled to the i-th word line, the first source/drain(i, j) being coupled to the j-th BD region, the second source/drain(i, j) being coupled to the first source/drain(i, j+1);

wherein when the memory cell M (i, j) is processed, the i-th word line is enabled, the first source/drain(i, j) is coupled to the j-th bit line via the j-th BD region and the j-th bank select MOS transistor, in order to compensate the voltage drop resulting from the resistance of the j-th bit line and the j-th BD region, at least one of the voltage applied to the i-th word line and the voltage applied to the j-th bit line is adjusted according to the position of the bank which the memory cell M (i, j) belongs to.

2. The memory according to claim 1, wherein each bank comprising Q sub-banks, when the memory cell M (i, j) is processed, at least one of the voltage applied to the i-th word line and the voltage applied to the bit line which connected to M (i, j) is further adjusted according to the position of the sub-bank which the memory cell M (i, j) belongs to.

3. The memory according to claim 1, wherein when the memory cell M (i, j) is processed, the voltage applied to the bank select line is adjusted according to the position of the bank which the memory cell M (i, j) belongs to.

4. The memory according to claim 1, wherein when the memory cell M (i, j) is processed, the drain side voltage of the memory cell M (i, j) or the source side voltage of the memory cell M (i, j) is substantially adjusted according to the position of the bank which the memory cell M (i, j) belong to.

5. The memory according to claim 1, wherein at least one of the voltages applied to the i-th word line and the voltage applied to the bit line which connected to is adjusted further in order to compensate the voltage drop of the j-th band select MOS transistor.

6. The memory according to claim 1, wherein at least one of the voltage applied to the i-th word line and the voltage applied to the j-th bit line is adjusted so that the currents flow to respective memory cells when the memory cells are processed are substantially equal to each other.

7. The memory according to claim 1, wherein the memory cells are formed on the same substrate or different substrates, when the memory cell M (i, j) is processed, the voltage applied to the substrate on which the memory cell M (i, j) is formed is adjusted according to the position of the bank and the position of the sub-bank which the memory cell M (i, j) belongs to.

8. The memory according to claim 1, wherein each bank further comprising:
    a plurality of BD strap local bit lines comprising a j-th BD strap local bit line; and
    a plurality of BD strap contacts, the BD strap contacts being arrange in Q lines substantially parallel to the word lines, the j-th BD region being coupled to the j-th BD strap local bit line via Q strap contacts, two of the Q strap contacts being coupled to the two ends of the j-th BD region, Q being an integer larger than one.

9. The memory according to claim 8, wherein each bank comprising Q−1 sub-banks, each sub-bank being defined by a first line and a second line of the Q lines which are adjacent to each other, at least one of the voltage applied to the i-th word line and the voltage applied to the j-th bit line is adjusted further according to the position of the sub-bank which the memory cell M (i, j) belongs to.

10. The memory according to claim 9, wherein each sub-bank comprising R sub-sub-banks, each sub-sub-bank comprising memory cells in a first row and memory cells in a second row, the distance between the first sources/drains of the memory cells in the first row and the first line is substantially equal to the distance between the second source/drains of the memory cells in the second row and the second line, at least one of the voltage applied to the i-th word line and the voltage applied to the j-th bit line is adjusted further according to the position of the sub-sub-bank which the memory cell M (i, j) belongs to, and R is an integer larger than one.

11. A driving method for a memory, the memory comprising P banks, P being integer, each bank comprising X word lines, Y bit lines, a bank select line, Y bank select MOS (Metal Oxide Semiconductor) transistors, Y buried diffusion (BD) region, X*Y memory cells in X rows and Y columns, X word lines being arranged in parallel, the X word lines comprising an i-th word line, X, i being integers, i being smaller or equal to X, the Y bit lines being substantially perpendicular to the word lines, the Y bit lines comprising a j-th bit line, Y and j being integers, j being smaller or equal to Y, the Y bank select MOS transistors comprising a j-th bank select MOS transistor, the j-th bank select MOS transistor being coupled to the j-th bit line and controlled by the bank select line; the Y BD regions comprising a j-th BD region, the j-th BD region being coupled to the j-th bank select MOS transistor, the memory cells comprising a memory cell M (i, j) located in i-th row and j-th column, the memory cell M (i, j) having a gate(i, j), a first source/drain(i, j), and a second source/drain(i, j), the gate(i, j) being coupled to the i-th word line, the first source/drain(i, j) being coupled to the j-th BD region, the second source/drain(i, j) being coupled to the first source/drain(i, j+1), the method comprising:
    enabling the i-th word line;
    coupling the first source/drain (i, j) to the j-th bit line via the j-th BD region and the j-th bank select MOS transistor; and
    adjusting at least one of the voltage applied to the i-th word line and the voltage applied to the j-th bit line according to the position of the bank which the memory cell M (i, j) belongs to, so as to compensate the voltage drop resulting from the resistance of the j-th bit line and the j-th BD region.

12. The method according to claim 11, wherein each bank comprising Q sub-banks, the adjusting step further comprising:
    adjusting at least one of the voltage applied to the i-th word line and the voltage applied to the j-th bit line further according to the position of the sub-bank which the memory cell M (i, j) belongs to.

13. The method according to claim 11, wherein the method further comprising:
    adjusting the voltage applied to the bank select line according to the position of the bank which the memory cell M (i, j) belongs to.

14. The method according to claim 11, wherein the memory cells are formed on the same substrate or different substrates or the memory cells are formed on the same well or different wells, the method further comprising:
    Adjusting the voltage applied to the substrate or well of memory cell according to the position of the bank which the memory cell (i, j) belongs to.

15. The method according to claim 11, wherein the drain side voltage of the memory cell M (i, j) or the source side voltage of the memory cell M (i, j) is substantially equal to the voltage applied to the j-th bit line.

16. The method according to claim 11, wherein the memory cells are formed on the same substrate or different substrates, the adjusting step further comprising:
    adjusting at least one of the voltage applied to the i-th word line, the voltage applied to the j-th bit line, and the voltage applied to the substrate on which the memory cell M (i, j) is formed, further in order to compensate the voltage drop of the j-th band select MOS transistor.

17. The method according to claim 11, wherein the memory cells are formed on the same substrate or different substrates, the adjusting step further comprising:
    adjusting at least one of the voltage applied to the i-th word line, the voltage applied to the j-th bit line, and the voltage applied to the substrate on which the memory cell M (i, j) is formed, so that the currents flow to respective memory cells when the memory cells are processed are substantially equal to each other.

18. The method according to claim 11, wherein each bank further comprising:
  a plurality of BD strap local bit lines comprising a j-th BD strap local bit line; and
  a plurality of BD strap contacts, the BD strap contacts being arrange in Q lines substantially parallel to the word lines, the j-th BD region being coupled to the j-th BD strap local bit line via Q strap contacts, two of the Q strap contacts being coupled to the two ends of the j-th BD region, Q being an integer larger than one.

19. The method according to claim 18, wherein each bank comprising Q–1 sub-banks, each sub-bank being defined by a first line and a second line of the Q lines which are adjacent to each other, the memory cells are formed on the same substrate or different substrates, the adjusting step further comprising:
  adjusting at least one of the voltage applied to the i-th word line and the voltage applied to the j-th bit line and the voltage applied to the substrate on which the memory cell M (i, j) is formed, further according to the position of the sub-bank which the memory cell M (i, j) belongs to.

20. The method according to claim 19, wherein each sub-bank comprising R sub-sub-banks, each sub-sub-bank comprising memory cells in a first row and memory cells in a second row, the distance between the first sources/drains of the memory cells in the first row and the first line is substantially equal to the distance between the second source/drains of the memory cells in the second row and the second line, the adjusting step further comprising:
  adjusting at least one of the voltage applied to the i-th word line and the voltage applied to the j-th bit line and the voltage applied to the substrate on which the memory cell M (i, j) is formed, further according to the position of the sub-sub-bank which the memory cell M (i, j) belongs to, and R is an integer larger than one.

* * * * *